MINIATURE ADJUSTABLE HIGH FREQUENCY RESONANT CIRCUIT UNIT

Filed Sept. 29, 1966

MINIATURE ADJUSTABLE HIGH FREQUENCY RESONANT CIRCUIT UNIT

Filed Sept. 29, 1966 Sheet 4 of 4

3,421,122
Patented Jan. 7, 1969

3,421,122

MINIATURE ADJUSTABLE HIGH FREQUENCY RESONANT CIRCUIT UNIT

Yukio Ito, Tokyo, and Hidemitsu Komizo, Kawasaki-shi, Japan, assignors to Fujitsu Limited, Kawasaki, Japan, a corporation of Japan Filed Sept. 29, 1966, Ser. No. 582,993
Claims priority, application Japan, Sept. 30, 1965, 40/61,103
U.S. Cl. 333—82 6 Claims
Int. Cl. H01p *7/00;* H01p *1/00;* H01p *3/00*

The present invention relates to a miniature high frequency resonant circuit unit. More particularly, the invention relates to a miniature adjustable high frequency resonant circuit unit operable in the ultrahigh frequency band.

Prior to the present invention, the mechanical length of a resonant circuit operable in the ultrahigh frequency band had to be approximately ½ to ¼ of the wavelength in free space. Furthermore, the impedance or admittance characteristics of the resonant circuit was periodic in operation over a broad frequency range. The zero points or polarity changeovers occur alternately at a regular interval. Since the distributed constant circuits of the prior art are approximately as long as the wavelength of the resonant frequency, it is difficult to provide the necessary filter characteristics over a wide frequency band. It is also difficult for the large-dimensioned resonant circuits or filters of the prior art to operate with high efficiency over a broad band of ultrahigh frequencies in multipliers, dividers, amplifiers, oscillators or freqency converters which utilize semiconductor components. The dimensions of the semiconductor components are usually small compared to the wavelength of the operating frequency. The semiconductor components may comprise varactors, tunnel or Esaki diodes, transistors and/or spacistors. Furthermore, in many cases, the operating frequency range is extended from several times greater to several tens of times greater than the drive frequency. In order to operate such semiconductor components in a high frequency range to provide desired results, the resonant circuits or filters of the transmission line must have suitable characteristics over a sufficiently wide frequency range.

The principal object of the present invention is to provide a new and improved miniature adjustable high frequency resonant circuit unit. The miniatiure adjustable high frequency resonant circuit units of the present invention are efficiently utilized in ultrahigh frequency circuits which include semiconductor components and are adjustable with facility and efficiency. The resonant circuit unit of the present invention has very small dimensions and a wide operating range. The components of the resonant circuit unit of the present invention are adjusted with facility and simplicity so that said unit operates with efficiency, effectiveness and reliability.

In accordance with the present invention, the miniature adjustable high frequency resonant circuit unit comprises a printed circuit including extremely small dimensional resonant circuit components in resonant circuit connection functioning as a resonant circuit in a broad range of frequency. Adjusting means in operative proximity with the printed circuit varies the values of the resonant circuit components thereby to vary the characteristics of the resonant circuit. The adjusting means comprises a flange fixedly mounted in operative proximity with the printed circuit and adjusting members movably mounted in the flange for movement toward and away from determined points on the printed circuit.

In order that the present invention may be readily carried into effect, it will now be described with reference to the accompanying drawings, wherein.

Figure 1:
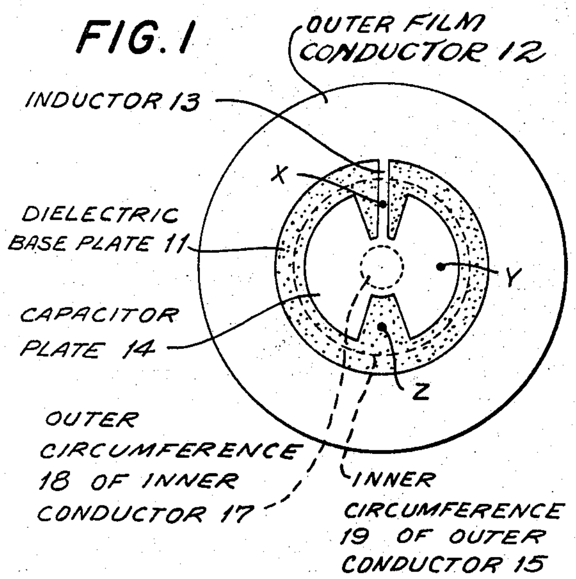
FIG. 1 is a cross-sectional view of an embodiment of a miniature adjustable resonant circuit unit of the present invention.
Figure 2:
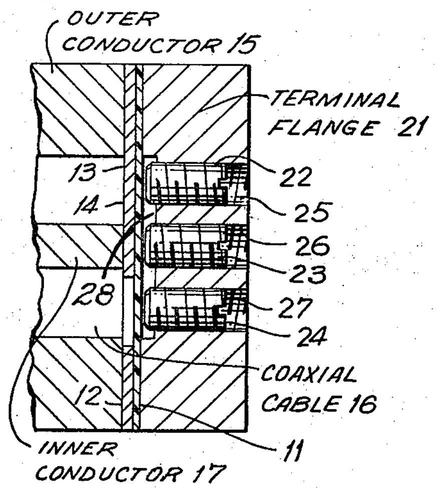
FIG. 2 is a longitudinal sectional view of a coaxial cable in which the embodiment of the resonant circuit unit of FIG. 1 is utilized.

In FIGS. 1 and 2, a parallel resonant circuit which functions as a filter is provided as a printed circuit. A dielectric base plate 11, of dielectric material of thin film configuration, supports copper foil sections 12, 13 and 14 provided thereon by any suitable means such as, for example, photoetching. The section 12 is of annular configuration and functions as an outer film conductor which is electrically connected to the outer conductor of a coaxial cable in which the resonant circuit is utilized.

The section 13 is of narrow strip configuration and functions as an inductor. The inductor strip 13 extends from the outer film conductor 12 and a capacitor plate 14 and is electrically connected to both. The section 14 thus functions as the capacitor plate. The inductor 13 extends in a substantially radial direction in the plane of the copper foil sections 12, 13 and 14. The capacitor plate 14 is of substantially circular configuration having diametrically positioned, spaced, opposed notches cut out therefrom. The capacitor plate 14 provides a parallel capacitance with the outer conductor 15 of a coaxial cable 16 in which the resonant circuit of the present invention is utilized, or with the wall of a waveguide in which it is utilized. The inductor 13 provides a parallel inductance with the outer conductor 15 and inner conductor 17 of the coaxial cable 16.

The copper foil sections 13 and 14 may be varied in configuration from their configurations shown in FIG. 1 and may provide parallel inductance and capacitance in the manner of FIG. 1.

In FIG. 2, the resonant circuit of FIG. 1 is positioned at the end of the coaxial cable 16. The coaxial cable 16 comprises the outer conductor 15 and the inner conductor 17. The inner conductor 17 of the coaxial cable 16 is in electrical contact with the axial central area of the capacitor plate 14 and the outer film conductor 12 is in electrical contact with the outer conductor 15 of said cable. The outer circumference 18 of the inner conductor 17 of the coaxial cable 16 is shown in FIG. 1 in its electrical contact relationship with the resonant circuit unit of the present invention. The inner circumference 19 of the outer conductor 15 of the coaxial cable 16 is also shown in FIG. 1 in its electrical contact relationship with the resonant circuit unit of the present invention.

In FIG. 2, the copper foil sections 12, 13 and 14 of the resonant circuit unit abut the corresponding inner and outer conductors 17 and 15 of the coaxial cable 16 and the dielectric base plate 11 of said resonant circuit unit abuts a terminal flange 21. The copper foil sections 12, 13 and 14 of the resonant circuit unit are made DC conductive or nonconductive by the dielectric base plate 11, which is positioned between the coaxial cable 16 and the terminal flange 21. The dielectric base plate 11 has a large electrostatic capacity when the copper foil sections 12, 13 and 14 are made nonconductive, so that it functions as a short circuit at high frequencies.

Threaded adjusting members or screws 22, 23 and 24 are threadedly engaged in threaded bores 25, 26 and 27, respectively, formed through the base of the terminal flange 21. The adjusting member 22 may abut the resonant circuit 11, 12, 13, 14 at a point X. The adjusting member 23 may abut the resonant circuit 11, 12, 13, 14 at a point Y. The adjusting member 24 may abut the resonant circuit 11, 12, 13, 14 at a point Z. The threaded adjusting members 22, 23 and 24 are rotated in their corresponding bores 25, 26 and 27, respectively, and are thereby moved in directions parallel to the axis of the coaxial cable and the resonant circuit unit toward and away from the resonant circuit 11, 12, 13, 14, as desired, to adjust the characteristics of said resonant circuit.

The diameters of the adjusting members 22, 23 and 24 are selected in accordance with the dimensions of the resonant circuit 11, 12, 13, 14 and in accordance with the characteristics desired for said resonant circuit. When the adjusting member 22 is moved toward the point X, for example, it will effect the characteristics of the resonant circuit in the following manner, if the diameter of said adjusting member is large enough so that said adjusting member covers part of each of the inductor 13 and the capacitor plate 14. The inductive reactance or impedance of the inductor 13 is decreased by the adjusting member 22 and the capacitance between the capacitor plate 14 and the terminal flange 21 is increased. If the diameter of the adjusting member 22 is suitably determined in accordance with the copper foil sections 13 and 14, the decrease in inductance and the increase in capacitance may be made to cancel each other so that the resonant frequency is maintained almost constant and only the loaded quality factor of the resonant circuit is varied.

The movement of the adjusting member 23 toward the point Y varies only the capacitance between the capacitor plate 14 and the terminal flange 21. When the adjusting member 24 is moved toward the point Z, only the leakage capacitance between said adjusting member and the edge of the capacitor plate 14 is varied slightly and the resonant characteristics of the resonant circuit are hardly effected.

Figure 3:
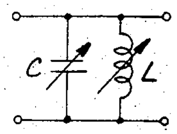
FIG. 3 is a circuit diagram of the equivalent circuit of the resonant circuit unit of FIGS. 1 and 2.
Figure 4:
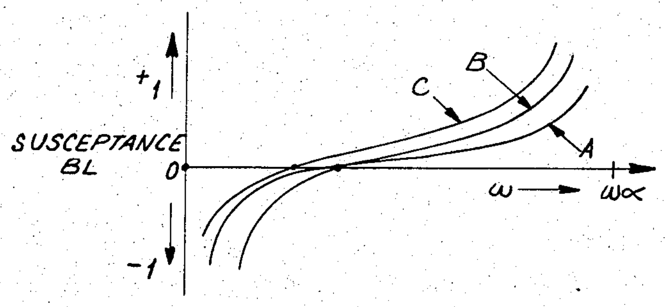
FIG. 4 is a graphical presentation of the frequency response characteristics of the normalized susceptance of the resonant circuit unit of FIGS. 1 and 2.

FIG. 3 is the equivalent circuit of the resonant circuit unit of FIGS. 1 and 2. FIG. 4 is a graphical presentation of the frequency response characteristics of the normalized susceptance of the resonant circuit unit of FIGS. 1 and 2. In FIG. 4, the abscissa represents $\omega$ or $2\pi f$, where $f$ is the frequency, and the ordinate represents the susceptance, or reciprocal of reactance, BL of the inductance L of FIG. 3. In FIG. 4, curve A is provided when none of the adjusting members 22, 23 and 24 is moved toward the resonant circuit 11, 12, 13, 14 (FIGS. 1 and 2). Curve B is provided when the adjusting member 22 is moved toward the resonant circuit 11, 12, 13, 14. Curve C is provided when the adjusting member 23 is moved toward the resonant circuit 11, 12, 13, 14.

In FIG. 4, the upper limit frequency $\omega\mu$ is approximately 38 gigacycles. The circuit constants are frequency responsive to some extent, so that the inductance L and the capacitance C (FIG. 3) each varies over a broad range of frequencies. The normalized susceptance BL of the inductance L may be defined as $$(1) \qquad BL = Zo/\omega L$$

where $Zo$ is the characteristic impedance of the coaxial cable, $\omega$ is the angular frequency $2\pi f$, where $f$ is the frequency, and L is the inductance. Furthermore, $$(2) \qquad BL \doteqdot Zo/Zo' \cot \beta l$$

where $Zo'$ is the equivalent characteristic impedance produced by the space between the inductor 13 (FIG. 1) and the inner conductor 17 of the coaxial cable 16 (FIG. 2), the terminal flange 21 and the adjusting member 22 (FIG. 2), $\beta$ is a phase constant which is $2\pi/\lambda$, where $\lambda$ is the wavelength in free space, and $l$ is the distance between the point of joinder of the inductor 13 with the outer film conductor 12 and the point of joinder of said inductor with the capacitor plate 14. Thus, $$(3) \qquad L = \frac{Zo'}{\omega} \tan \beta l$$

The foregoing Equation 3 indicates that the inductance L varies with frequency and becomes infinitely great at a frequency of $VC/4l$, where VC is the velocity of light, so that $\beta l$ equals $\pi 2$ radian. The inductance becomes capacitive above the frequency $VC/4/l$. If $l$ is sufficiently small relative to the resonance wavelength such as, for example, $\beta l \leq \pi/4$ radian, the inductance L can maintain the inductive function with a frequency range less than $2fo$, where $fo$ is the operating frequency.

The magnitude $\beta l$ may be selected in accordance with the characteristics or constants of the semiconductor material utilized in the ultrahigh frequency circuit and in accordance with the function or purpose of such circuit, but is preferably of small magnitude. The magnitude $\beta l$ may be small when the loss is negligible. Thus, for example, in an amplifier or oscillator utilizing a negative resistance component, or in a multiplier, divider or converter utilizing a variable capacitor, $\beta l < \pi/6 \sim \pi/10$ radian is preferable.

Since cot $\beta l$ is greater if $\beta l$ is made as small as possible to avoid circuit periodicity, $Zo'$ must be increased in order to provide a desired susceptance BL (Equation 2) when $Zo$ is constant. This may be accomplished either by decreasing the width of the inductor 13 and increasing the space between said inductor and the terminal flange 21, or by providing a dielectric constant in the area 28 between the dielectric base plate 11 and the adjusting members 22, 23 and 24 which is close to the dielectric constant of said dielectric base plate. The movement of the adjusting member 22 toward the resonant circuit 11, 12, 13, 14 decreases $Zo'$ primarily.

Figure 5:
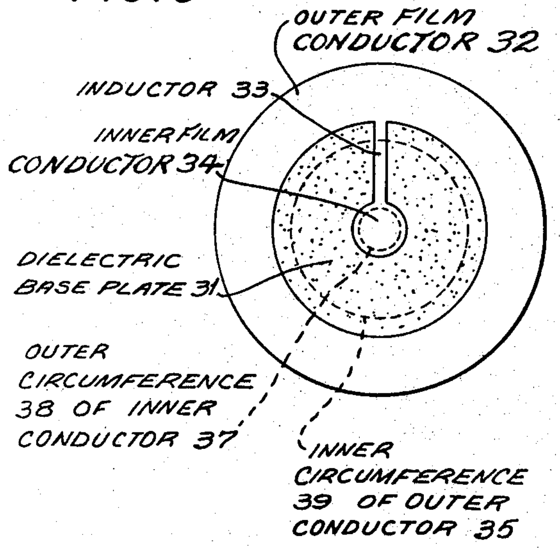
FIG. 5 is a cross-sectional view of another embodiment of a miniature adjustable resonant circuit unit of the present invention.
Figure 6:
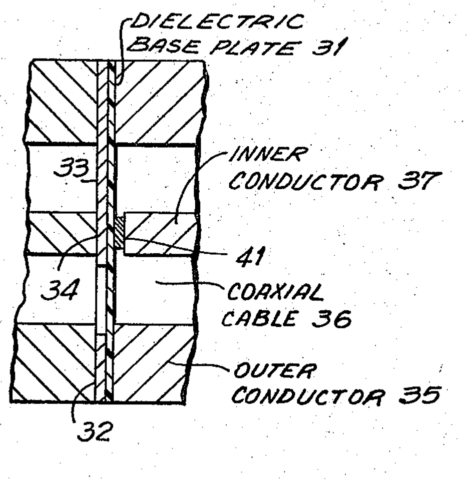
FIG. 6 is a longitudinal sectional view of a coaxial cable in which the embodiment of the resonant circuit unit of FIG. 5 is utilized.

The resonant circuit unit of FIGS. 5 and 6 provides only a parallel inductance. A dielectric base plate 31, of dielectric material of thin film configuration, supports copper foil sections 32, 33 and 34 provided thereon. The section 32 is of annular configuration and functions as an outer film conductor which is electrically connected to the outer conductor 35 of a coaxial cable 36 in which the resonant circuit is utilized.

The section 33 is of narrow strip configuration and functions as an inductor. The narrow strip 33 extends from the outer film conductor 32 and an inner film conductor 34. The section 34 thus functions as the inner film conductor. The inductor 33 extends in a substantially radial direction in the plane of the copper foil sections 32, 33 and 34. The inner film conductor 34 is of circular configuration.

In FIG. 6, the resonant circuit of FIG. 5 is positioned in the coaxial cable 36 at an intermediate area, rather than at the end as in FIG. 2. The coaxial cable 36 comprises the outer conductor 35 and an inner conductor 37. The inner conductor 37 of the coaxial cable is in electrical contact with the inner film conductor 34 and the outer film conductor 32 is in electrical contact with the outer conductor 35 of said cable. The outer circumference 38 of the inner conductor 37 of the coaxial cable 36 is shown in FIG. 5 in its electrical contact relationship with the resonant circuit unit of the present invention. The inner circumference 39 of the outer conductor 35 of the coaxial cable 36 is also shown in FIG. 5 in its electrical contact relationship with the resonant circuit unit of the present invention.

The inner film conductor 34 and a copper foil section 41 (FIG. 6) are electrically connected to each other by any suitable means such as, for example, chemical means or mechanical means such as a connecting pin (not shown in FIG. 6). The copper foil section 41 is on the surface of the dielectric base plate 31 opposite that bearing the copper foil sections 32, 33 and 34. The copper foil section 41 is in electrical contact with the inner conductor 37 of the coaxial cable 36.

Figure 7:
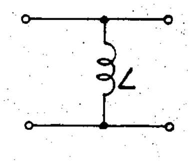
FIG. 7 is a circuit diagram of the equivalent circuit of the resonant circuit unit of FIGS. 5 and 6.
Figure 8:
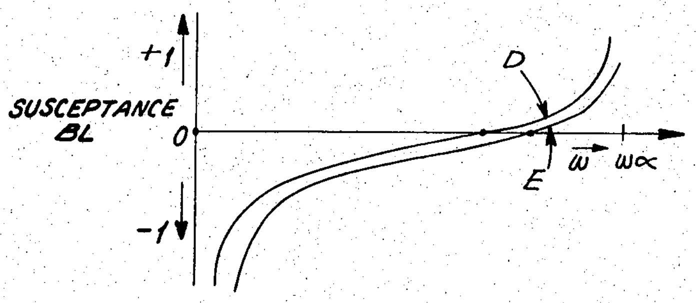
FIG. 8 is a graphical presentation of the frequency response characteristics of the normalized susceptance of the resonant circuit unit of FIGS. 5 and 6.

FIG. 7 is the equivalent circuit of the resonant circuit unit of FIGS. 5 and 6. FIG. 8 is a graphical presentation of the frequency response characteristics of the normalized susceptance of the resonant circuit unit of FIGS. 5 and 6. In FIG. 8, the abscissa represents $\omega$ or $2\pi f$, where $f$ is the frequency, and the ordinate represents the susceptance, or reciprocal of reactance, BL of the inductance L of FIG. 7. In FIG. 8, curve D is provided when the resonant circuit of FIG. 5 is at a cable end as in FIG. 2 and none of the adjusting members is moved toward the resonant circuit 31, 32, 33, 34. Curve E is provided when an adjusting member similar to the adjusting member 22 of FIG. 2 is moved toward the resonant circuit 31, 32, 33, 34. The resonant circuit units of FIGS. 1 and 2 and of FIGS. 5 and 6 may be combined.

Figures 9, 10, 11, 12:
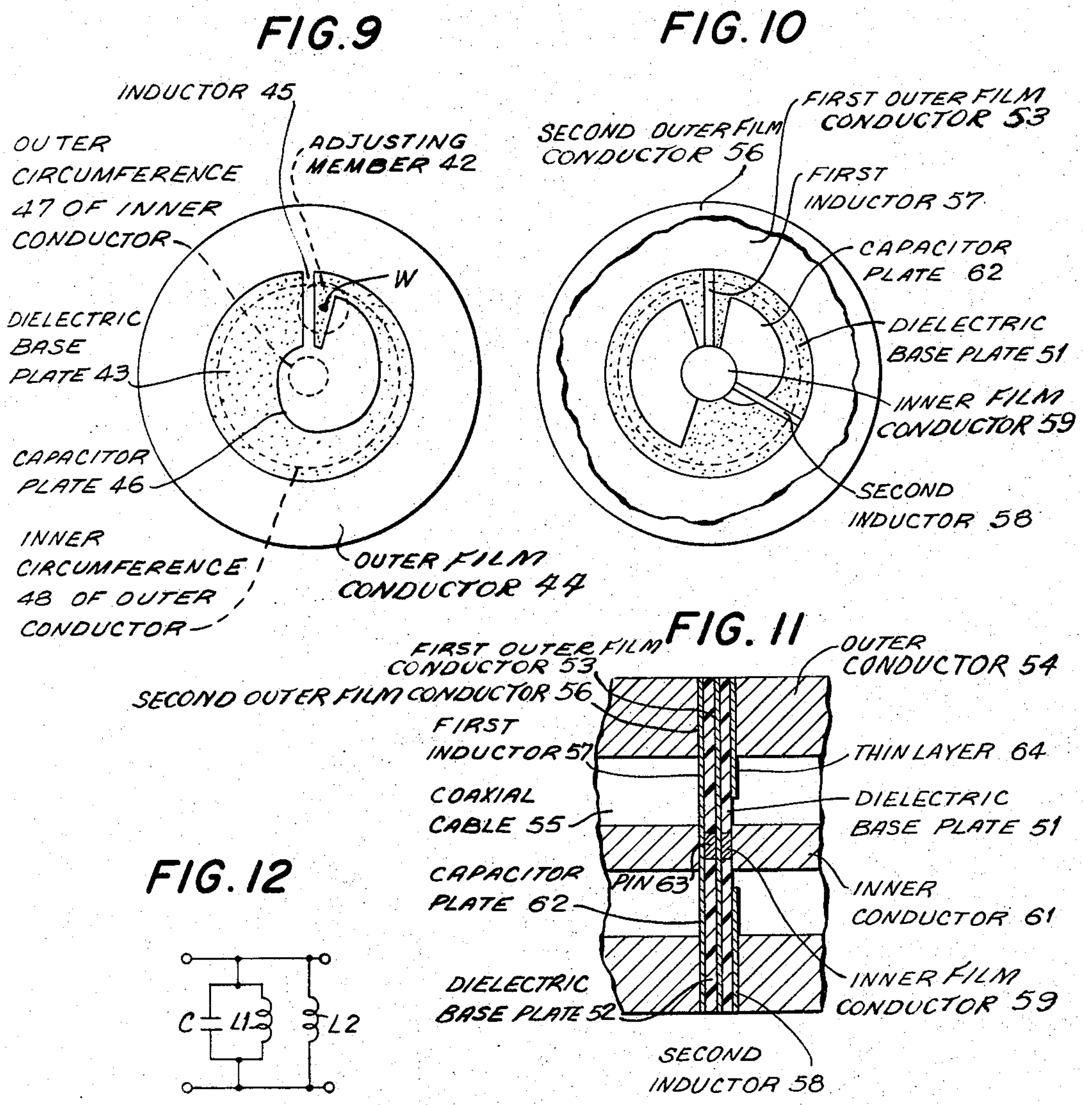
FIG. 9 is a cross-sectional view of another embodiment of the miniature adjustable resonant circuit unit of the present invention.
FIG. 10 is a cross-sectional view of another embodiment of the minature adjustable resonant circuit unit of the present invention.
FIG. 11 is a longitudinal sectional view of a coaxial cable in which the embodiment of the resonant circuit unit of FIG. 10 is utilized.
FIG. 12 is a circuit diagram of the equivalent circuit of the resonant circuit unit of FIGS. 10 and 11.

FIG. 9 is another embodiment of the resonant circuit unit of the present invention. In FIG. 9, an adjusting member 42, which is similar to each of the adjusting members 22, 23 and 24 of FIG. 2, is moved toward a point W on a dielectric base plate 43. The dielectric base plate 43 supports copper foil sections 44, 45 and 46. The section 44 is of annular configuration and functions as an outer film conductor which is electrically connected to the outer conductor of a coaxial cable in which the resonant circuit is utilized.

The section 45 is of narrow strip configuration and functions as an inductor. The narrow strip 45 extends from the outer film conductor 44 and a capacitor plate 46 and is electrically connected to both. The section 46 thus functions as the capacitor plate. The inductor 45 extends in a substantially radial direction in the plane of the copper foil sections 44, 45 and 46. The capacitor plate 46 is of irregular curvilinear configuration and provides a parallel capacitance with the outer conductor of the coaxial cable in which the resonant circuit of the present invention is utilized. The inductor 45 provides a parallel inductance with the outer conductor of the coaxial cable.

The outer circumference 47 of the inner conductor of the coaxial cable is shown in FIG. 9 in its electrical contact relationship with the resonant circuit unit of the present invention. The inner circumference 48 of the outer conductor of the coaxial cable is also shown in FIG. 9 in its electrical contact relationship with the resonant circuit unit of the present invention.

The movement of the adjusting member 42 toward the point W effects both the inductance of the inductor 45 and the capacitance of the capacitor plate 46, so that the resonant frequency and the loaded quality factor of the resonant circuit are thereby adjusted or varied. If the point W is suitably located on the resonant circuit, the loaded quality factor may be adjusted or regulated within a specific range with slight variation in the resonant frequency.

FIGS. 10 and 11 illustrate a resonant circuit unit which combines the embodiment of FIGS. 5 and 6 with the embodiment of FIG. 9. In FIG. 11, the resonant circuit of FIG. 10 is positioned in a coaxial cable at an intermediate area. A pair of dielectric base plates 51 and 52 support a plurality of copper foil sections. A copper foil section 53 is of annular configuration and functions as a first outer film conductor which is electrically connected to the outer conductor 54 of a coaxial cable 55 in which the resonant circuit is utilized. A copper foil section 56 is of annular configuration and functions as a second outer film conductor which is electrically connected to the outer film conductor 54.

A copper foil section 57 of narrow strip configuration functions as a first inductor. A copper foil section 58 of narrow strip configuration functions as a second inductor. The first inductor strip 57 extends from the first outer film conductor 53 and an inner film conductor copper foil section 59 and is electrically connected to both. The second inductor strip 58 extends from the second outer film conductor 56 and the inner film conductor 59 and is electrically connected to both. Each of the first and second inductors 57 and 58 extends in a substantially radial direction in the plane of its corresponding copper foil sections. The inner film conductor 59 is of circular configuration and is in electrical contact with the inner conductor 61 of the coaxial cable 55.

A copper foil section 62 functions as the capacitor plate and is associated with the first inductor 57. The inner film conductor 59 is associated with the second inductor 58. The inner film conductor 59 is electrically connected to the resonant circuit by an electrically conductive pin 63. A thin layer 64 of electrically conductive material is positioned between the capacitor plate 62 and the outer conductor 54 of the coaxial cable 55. The thin layer 64 is of substantially annular configuration. The outer conductor 54 of the coaxial cable 55 provides specific impedances between the capacitor plate 62 and the thin layer 64 and between the first and second inductors 57 and 58 and said thin layer.

If the angle between the primary circuit elements comprising the first inductor 57 and the capacitor plate 62 and the secondary circuit elements comprising the pin 63 and the second inductor 58 is varied, the position of the second inductor 58 relative to the capacitor plate 62 varies. It is thus possible to vary the inductance of the second inductor 58 without practically influencing the capacitance between the capacitor plate 62 and the thin layer 64. The capacitance and first and second inductances are in parallel. The variation of the inductance of the second inductor 58 without practical influence on the capacitance is due to the decrease of the impedance $Zo'$ produced by the second inductor strip 58 when said second inductor strip is rotated a small amount in a counterclockwise direction thereby decreasing the equivalent inductance. In other words, in the embodiment of FIGS. 10 and 11, the circuit elements are similar in dimension and configuration and the circuit constants or characteristics are varied by variation of the positions of such elements relative to each other.

FIG. 12 is the equivalent circuit of the resonant circuit unit of FIGS. 10 and 11. The first inductor 57 provides the first parallel inductance L1, the second inductor 58 provides the second parallel inductance L2 and the capacitor provides the parallel capacitance C. The second inductance L2 may be varied by variation of the relative positions of the capacitor plate 62 and the second inductor strip 58.

Figure 13:
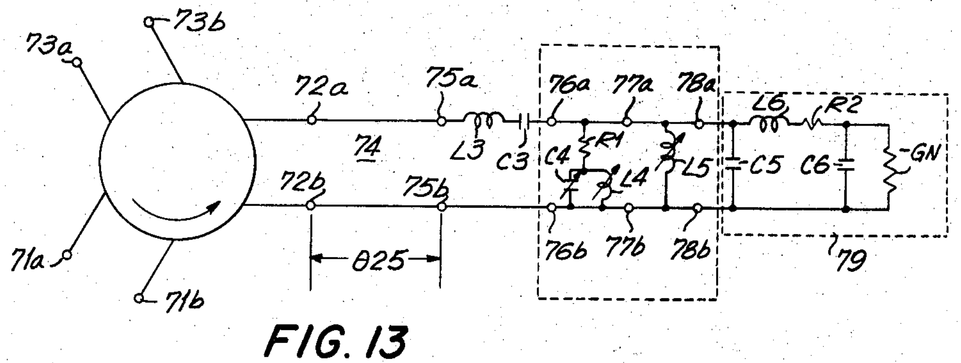
FIG. 13 is a circuit diagram of a circulator reflection type negative resistance amplifier utilizing the resonant circuit unit of the present invention.
Figure 14:
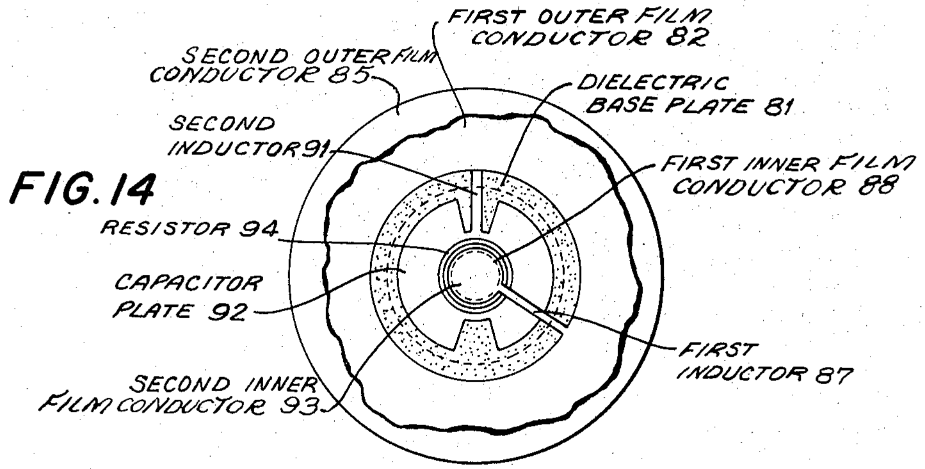
FIG. 14 is a cross-sectional view of an embodiment of the adjustable resonant circuit unit of the present invention which may be utilized in the amplifier of FIG. 13.
Figure 15:
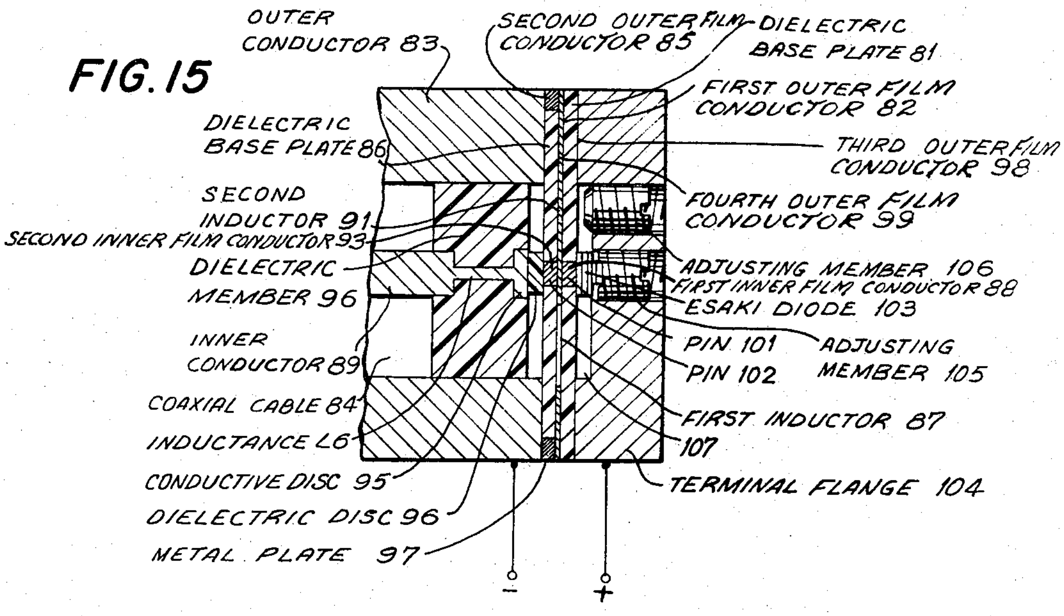
FIG. 15 is a longitudinal sectional view of an embodiment of an Esaki diode mounting portion which may be utilized in the amplifier of FIG. 13.

The variation and adjustment of the circuit characteristics or constants of the resonant circuit unit of the present invention is effective in an Esaki or tunnel diode amplifier circuit which utilizes a resistance insertion type resonant circuit. FIGS. 13, 14 and 15 are illustrations of practical applications of the present invention. FIG. 13 illustrates a circulator reflection type negative resistance amplifier.

In FIG. 13, high frequency electrical power is supplied to the circulator via input terminals 71*a* and 71*b* and is provided at output terminals 72*a* and 72*b*. The circulator may be connected to another circulator, as it usually is, via terminals 73*a* and 73*b*.

A coaxial cable or line 74 is connected from the terminals 72*a* and 72*b* to a pair of terminals 75*a* and 75*b* at an electrical length of $\theta$ 25 radians from the terminals 72*a* and 72*b*. The coaxial cable 74 includes negative resistance elements which include the resonant circuit unit of the present invention shown in FIGS. 14 and 15. The necessary voltage supply or biasing circuitry is omitted for the sake of clarity of illustration.

A series resonant circuit of lumped constants is connected between the terminals 75*a* and 75*b* and terminals 76*a* and 76*b*. A resistance insertion type parallel resonant circuit is connected between the terminals 76*a* and 76*b* and terminals 77*a* and 77*b*. A parallel inductance is connected between the terminals 77*a* and 77*b* and terminals 78*a* and 78*b*. The series resonant circuit comprises an inductor L3 and a capacitor C3 connected in series. The parallel resonant circuit comprises a resistor R1 and the parallel connection of an inductor L4 and a capacitor C4 connected in series with the resistor R1, the series connection being connected in parallel across the line. The parallel inductance comprises the parallel connected inductor L5.

A negative resistance element such as, for example, an Esaki or tunnel diode 79 is connected to the terminals 78*a* and 78*b* and is represented by its equivalent circuit, wherein C5 is the stray capacitance between said diode and said terminals, L6 is the series inductance of said diode, R2 is the series resistance of said diode, C6 is the capacitance of the junction of said diode, and —GN is a negative conductance.

The normalized admittance characteristic seen from the terminals 72*a* and 72*b* irregularly rotate on the entire phase area in the Smith chart in both amplitude and phase in a broad frequency range. In consideration of the narrow frequency band around the central frequency of amplification, the admittance characteristic seen from the terminals 72*a* and 72*b* indicate a parallel resonance characteristic. Thus, if $\theta 25 \doteqdot \pi/2$ radian at the operating frequency *fo*, the admittance characteristic of the circulator side seen from the terminals 75*a* and 75*b* indicate a series resonance characteristic.

The series resonance characteristic in the upper and lower frequencies far from the operating frequency is not perfect or regular, but fluctuates irregularly. The series resonent circuit connected between the terminals 75*a*, 75*b* and the terminals 76*a*, 76*b* brings such irregularities within the frequency band close to the open side, so that the admittance characteristics of the load seen from the terminals 76*a* and 76*b* indicate an almost perfect series resonance characteristic near the operating frequency band. Furthermore, outside the operating frequency band, the admittance characteristic approach close to the open side in phase.

The resistance R1 connected in parallel between the terminals 76*a*, 76*b* and 77*a*, 77*b* for stabilization, is connected in series with the parallel resonant circuit comprising the inductance L4 and the capacitance C4. The equivalent normalized admittance $Y=G+jB$ between the terminals 76*a*, 76*b* and 77*a*, 77*b* varies with frequency. This is due to the fact that $G\approx 0$ within the band and $G\approx 1$ outside the band, if R1 is close to the characteristic impedance of the line. Thus, a loss is caused by R1 outside the band, but within the band there is almost no loss, and $jB$ causes a susceptance characteristic.

The load susceptance characteristic at the terminals 76*a* and 76*b* is cancelled by B. The admittance characteristic of the load seen from the terminals 77*a* and 77*b* indicates comparatively wide band characteristics within the band. On the other hand, the conductance of the load, GL, becomes greater than 1 outside the band and becomes, for example, approximately 2.

If the parallel inductance L5 between the terminals 77*a*, 77*b* and 78*a*, 78*b* is tuned within the operating frequency band with the equivalent parallel capacitance of the diode 79 connected to said terminals 78*a* and 78*b* and the loaded quality factor of each circuit is adequate, the entire load admittance characteristic seen from —GN does not surround the —GN point within the frequency band of the negative resistance of said diode. The amplification operation may therefore be stable.

In a diode 79 having an extremely high cutoff frequency compared to the operating amplification frequency, there are limits to the magnitudes of R1, C4, L4 and L5 determined by the admittance characteristic $\theta 25$ of the circulator and the frequency response characteristic of the line and L6, R2 and C6 of said diode. Adjustment or variation of the magnitudes of R1, C4, L4 and L5 from the outside facilitates stable operation.

Since, in accordance with the present invention, the magnitudes of C4, L4 and L5 may be varied from the outside as desired, stable operation is readily and facilely attained, although the diode 79 constants or characteristics are non-uniform, and low noise, broadband amplification is attained at the desired operating frequency. FIGS. 14 and 15 illustrate the diode housing portion and the adjustable resonant circuit portion of FIG. 13. In FIG. 15, the resonant circuit of FIG. 14 is positioned in a coaxial cable at an intermediate area.

In FIG. 14, a dielectric base plate 81 supports a copper foil section 82 of annular configuration which functions as a first outer film conductor and is electrically connected to the outer condunctor 83 of the coaxial cable 84 (FIG. 15) via a copper foil section 85. The copper foil section 85 is supported by a dielectric base plate 86 (FIG. 15) and is of annular configuration and functions as a second outer film conductor which is electrically connected to the outer conductor 83.

A copper foil section 87 of narrow strip configuration supported by the dielectric base plate 81 functions as a first inductor L5 and extends from the first outer film conductor 82 and a first inner film conductor copper foil section 88 supported by said dielectric base plate and is electrically connected to both. The first inductor 87 extends in a substantially radial direction in the plane of the copper foil sections 82 and 88. The first inner film conductor 88 is of circular configuration and is in electrical contact with the inner conductor 89 of the coaxial cable 84 (FIG. 15).

The dielectric base plate 86 (FIG. 15) supports the second outer film conductor 85 and a copper foil section 91 of narrow strip configuration which functions as a second inductor L4 (FIG. 13). The second inductor 91 extends from the second outer film conductor 85 and a copper foil section 92 supported by the dielectric base plate 86 (FIG. 15) which functions as a capacitor plate of the capacitance C4 (FIG. 13). The second inductor 91 is electrically connected to the second outer film conductor 85 and to the capacitor plate 92 and extends in a substantially radial direction in the plane of the copper foil sections 85 and 92.

The capacitor plate 92 is electrically connected to a second inner film conductor copper foil section 93 supported by the dielectric base plate 86 (FIG. 15) by means of a resistor copper foil section 94 supported on said dielectric base plate and providing the stabilizing resistance R1 (FIG. 13). The second inner film conductor 93 is of circular configuration and is in electrical contact with the inner conductor 89 of the coaxial cable 84 (FIG. 15). The resistor 94 is of substantially annular configuration and is coaxially positioned with the second inner film conductor 93 and the capacitor plate 92 around said second inner film conductor and within said capacitor plate. The capacitor plate 92 is of substantially annular configuration which diametrically positioned opposed notches formed therein.

In FIG. 15, the diode 79 (FIG. 13) is included with the combination resonant circuit of FIG. 14. In FIG. 15, the coaxial cable 84 extends from the terminals **72*a* and 72*b* of FIG. 13. The diode 79 (FIG. 13) comprises the series inductance L6 which extends coaxially from the inner conductor 89 of the coaxial cable 84 to a coaxial conductive disc 95. The inductance L6 electrically connects the inner conductor 89 and the disc 95**.

A dielectric member 96 of substantially cylindrical configuration supports the inner conductor 89 of the coaxial cable 84, the inductance L6 and the conductive disc 95, and transforms the impedance of this portion and controls the characteristic impedance of said inductance to a desired value. The second inner film conductor 93 (FIG. 14) is spaced from the conductive disc 95 and a dielectric disc 96 of electrical insulating material is interposed between said conductive disc and said second inner film conductor 93. A thin metal plate 97 of substantially annular configuration is provided around the dielectric base plate 86 and permits DC conductivity of the outer conductor 83 and of both the first and second outer film conductors 82 and 85, respectively.

A copper foil section 98 is supported by the dielectric base plate 81 on its surface opposite that supporting the first outer film conductor 82 (FIG. 14). The copper foil section 98 is of annular configuration and functions as a third outer film conductor. A copper foil section 99 is supported by the dielectric base plate 86 on its surface opposite that supporting the second outer film conductor 85 (FIGS. 14 and 15). The copper foil section 99 is of annular configuration and functions as a fourth outer film conductor.

Axially positioned electrically conductive pins 101 and 102 are positioned through the dielectric base plates 81 and 86, respectively, to close a circuit therethrough. An Esaki or tunnel diode 103 is positioned adjacent the resonant circuit which includes the dielectric base plate 81. A terminal flange 104 is positioned at the end of the coaxial cable 84 on the same surface of the dielectric base plate 81 resonant circuit as the diode 103.

A threaded adjusting member or screw 105, mounted in the terminal flange 104 in the same manner as the adjusting members of the terminal flange 21 of FIG. 2, urges the diode 103 against the pin 101. Another, similar threaded adjusting member or screw 106 effects the inductance L4 (FIG. 13) by effecting the second inductor 91 and effects the capacitance C4 (FIG. 13) by effecting the capacitor plate 92 (FIG. 14). The area 107 formed by the terminal flange 104 may be filled partially or wholly with a dielectric material of a desired dielectric constant.

Furthermore, an adjusting member may be added to effect the inductance L5 (FIG. 13) by effecting the first inductor 87.

The capacitance C4, the inductance L4 and the inductance L5 (FIG. 13) may be varied or adjusted either separately or jointly in the embodiment of FIGS. 14 and 15 to operate the amplifier in a low noise region over a broad band against the given bias voltage with stability and facility. The values of C4, L4, L5 and R1 should be near the optimum values hereinbefore discussed and determined upon consideration of the aforediscussed characteristics and constants.

The printed circuits on the dielectric base plates 81 and 86 may be provided on a single base plate. The resonant circuit unit of the present invention is highly suitable for and applicable to high frequency circuits which utilize semiconductor components. Since the resonant circuit unit of the present invention is very small in dimensions or size, it has a wide operating range. The resonant circuit unit of the present invention operates with efficiency, effectiveness and reliability due to the simplicity and facility of the adjustment of its components. The resonant circuit unit of the present invention is readily mass-produced with high quality results and is outstandingly satisfactory in operation.

While the invention has been described by means of specific examples and in specific embodiments, we do not wish to be limited thereto, for obvious modifications will occur to those skilled in the art without departing from the spirit and scope of the invention.

We claim:

1. A miniature adjustable high frequency resonant circuit unit, comprising:

printed circuit means including extremely small dimensioned resonant circuit components in resonant circuit connection functioning as a resonant circuit in a broad range of frequencies, said printed circuit means comprising a dielectric plate having electrically conductive sections printed thereon, said conductive sections including a strip-like portion which functions as an inductor, one of said conductive sections functioning as a capacitor plate; and adjusting means in operative proximity with said printed circuit means for varying the values of said resonant circuit components thereby to vary the characteristics of said resonant circuit, said adjusting means comprising flange means fixedly mounted in operative proximity with said printed circuit means and adjusting members movably mounted in said flange means for movement toward and away from determined points on said printed circuit means, one of said adjusting members being movable toward and away from the strip-like portion of said printed circuit means and another of said adjusting members being movable toward and away from the capacitor plate of said printed circuit means.

2. A resonant circuit unit as claimed in claim 1, wherein said adjusting members are movable relative to points on said printed circuit means which are so positioned relative to said inductor and said capacitor plate that the inductance of said inductor and the capacitance provided by said capacitor plate are independently varied by the corresponding adjusting members.

3. A resonant circuit unit as claimed in claim 1, wherein said adjusting members are movable relative to points on said printed circuit means which are so positioned relative to said inductor and said capacitor plate that the inductance of said inductor and the capacitance provided by said capacitor plate are simultaneously varied by the corresponding adjusting members.

4. A resonant circuit unit as claimed in claim 2, wherein one of said points is on said inductor and another of said points is on said capacitor plate.

5. A resonant circuit unit as claimed in claim 3, wherein one of said points is on said dielectric plate between said inductor and said capacitor plate.

6. A resonant circuit unit as claimed in claim 1, wherein said adjusting members are substantially perpendicular to said dielectric plate and to said conductive sections.

References Cited

UNITED STATES PATENTS

| | | | |
|---|---|---|---|
| 2,513,392 | 7/1950 | Aust | 333—82 |
| 2,513,393 | 7/1950 | Frey | 333—82 |
| 2,871,359 | 1/1959 | Schreiner | 333—82 |
| 3,243,741 | 3/1966 | Bellman | 333—84 |

ELI LIEBERMAN, *Primary Examiner.*

L. ALLAHUT, *Assistant Examiner.*

U.S. Cl. X.R.

333—84, 97; 334—41